(12) United States Patent
Cockson et al.

(10) Patent No.: US 6,396,458 B1
(45) Date of Patent: May 28, 2002

(54) INTEGRATED MATCHED ANTENNA STRUCTURES USING PRINTED CIRCUIT TECHNIQUES

(75) Inventors: Mark G. Cockson; Kenneth D. Simmons; Donald E. T. Wingo, all of Lincoln, NE (US)

(73) Assignee: Centurion Wireless Technologies, Inc., Lincoln, NE (US)

( * ) Notice: Subject to any disclaimer, the term of this patent is extended or adjusted under 35 U.S.C. 154(b) by 0 days.

(21) Appl. No.: 08/694,901

(22) Filed: Aug. 9, 1996

(51) Int. Cl.$^7$ ................................................. H01Q 1/38
(52) U.S. Cl. ...................................... 343/860; 343/702
(58) Field of Search ........................ 343/700 MS, 702, 343/860, 715; H01Q 1/38

(56) References Cited

U.S. PATENT DOCUMENTS

| | | | |
|---|---|---|---|
| 3,641,576 A | 2/1972 | Farbanish | 343/743 |
| 4,063,201 A | 12/1977 | Komatsubara | 333/70 R |
| 4,785,305 A | * 11/1988 | Shyu | 343/715 |
| 4,992,800 A | * 2/1991 | Parfitt | 343/715 |
| 5,105,201 A | * 4/1992 | Nakase et al. | 343/715 |
| 5,363,114 A | 11/1994 | Shoemaker | |

FOREIGN PATENT DOCUMENTS

| | | |
|---|---|---|
| DE | 26 29 685 A1 | 1/1978 |
| EP | 0 337 196 A1 | 10/1989 |
| EP | 0 456 350 A1 | 11/1991 |
| EP | 0 514 316 A2 | 11/1992 |
| EP | 0 584 882 A1 | 3/1994 |
| EP | 0 641 035 A2 | 3/1995 |
| WO | WO 96/29756 | 9/1996 |

OTHER PUBLICATIONS

J. Michael Johnson and Yahya Rahmat–Samii, "The Tab Monopole", IEEE Transactions on Antennas and Propagation, vol. 45, No. 1, pp. 187–188, Jan. 1997.
Darrel Emerson, "Try a Twelfth–Wave Transformer", QST, pp. 43–44, Jun. 1997.
Keith R. Carver and James W. Mink, "Microstrip Antenna Technology", IEEE Trans. Antennas Propaga., vol. AP–29, No. 1, pp. 2–24, Jan. 1981.
David M. Pozar, "A Review of Bandwidth Enhancement Techniques for Microstrip Antennas" ECE Department, University of Massachusetts at Amherst, pp. 157–166.
"Microstrip Antennas". p. 27.
"The Frequency—Independent Planar Log–Spiral Antenna", p. 699.
Patent Abstracts of Japan, No. E1522, vol. 18, No. 148, Mar. 11, 1994, publ. 05–327331.

* cited by examiner

Primary Examiner—Michael C. Wimer
(74) Attorney, Agent, or Firm—Thomte, Mazour & Niebergal; Dennis L. Thomte (57) ABSTRACT

An apparatus and method for matching an antenna having a high or low impedance with a transceiver circuit having an impedance of 50 ohms. A multilayer substrate, such as one or more printed circuit boards, is provided and has the various components of a matching circuit formed on including a capacitor and an inductor. The components are formed on the substrate using printed circuit techniques. A radiating element is connected to the matching circuit. The radiating element may be a discrete antenna or may also be formed on the substrate.

31 Claims, 9 Drawing Sheets

INTEGRATED MATCHED ANTENNA STRUCTURES USING PRINTED CIRCUIT TECHNIQUES

BACKGROUND OF THE INVENTION

1. Field Of The Invention

The present invention relates to wireless communications equipment. More particularly, though not exclusively,.the present invention relates to an integrated matched antenna structure and method for using the same.

2. Problems In The Art

Many devices utilizing wireless communications use an antenna having a high impedance which requires the use of a matching circuit when connected to a transmitter or receiver to provide the maximum energy transfer to the antenna. In a typical prior art device, manufacturers add a matching circuit comprised of a number of discrete components soldered to a circuit board. When using a matching circuit, it is advantageous to reduce the size and cost of the matching circuit.

Typical prior art matching circuits utilize small size discrete components using surface mount methods to mount the discrete components to a circuit board. One disadvantage of using this technique comes from the necessity to either machine or hand place these components onto the circuit board. This requires additional assembly operations and an increased parts count thus increasing the size and cost of production. The small discrete components also have a lower power handling capability which limits the amount of power that can be dissipated in the circuit. The use of externally placed components also limits the packaging methods that can be used such as injection molding.

A typical prior art design of matching circuits to be used with an antenna to match a high or low impedance to a 50 ohm feed point have generally used discrete inductors and capacitors manufactured by component manufacturers and then placed into the circuit by conventional assembly techniques as noted above.

A technique is known in the prior art wherein microstrip transmission lines are used to form inductive or capacitive elements. However, these techniques use the inherent lumped constants associated with a transmission line and require lines of various widths and lengths to obtain the corresponding desired circuit element. The resulting transmission lines are fairly narrow in bandwidth and require extensive area on a printed circuit board.

3. Features Of The Invention

A general feature of the present invention is the provision of an apparatus and method for receiving or transmitting signals which overcomes problems found in the prior art.

A further feature of the present invention is a provision of an apparatus and method for receiving or transmitting signals which includes a matching circuit which is formed on a printed circuit board using printed circuit techniques.

A further feature of the present invention is the provision of an apparatus and method for receiving or transmitting signals which uses a matching circuit formed on a substrate eliminating the need for discrete elements.

Further features, objects and advantages of the present invention include:

An apparatus and method for receiving or transmitting signals which includes a matching circuit having an inductive and a capacitive element formed on a substrate.

An apparatus and method for receiving or transmitting signals which includes a substrate having a matching circuit and an antenna formed on the substrate.

An apparatus and method for receiving or transmitting signals which includes a matching circuit formed on a multilayer substrate which includes no discrete components.

An apparatus and method for receiving or transmitting signals which includes a matching circuit which has a higher efficiency and experiences less losses than circuits of the prior art.

An apparatus and method for receiving or transmitting signals which includes a matching circuit which is cheaper, easier to manufacturer, more reliable, and performs better than matching circuits of the prior art.

These as well as other objects, features and advantages of the present invention will become apparent from the following specification and claims.

SUMMARY OF THE INVENTION

The present invention relates to a method and apparatus for matching the impedance an antenna to that of an electronic circuit. A substrate is provided on which an inductor and capacitor are formed on the substrate using printed circuit techniques. An antenna is electrically connected to the matching circuit. The antenna may optionally be a conventional antenna or may be formed on the substrate.

DETAILED DESCRIPTION OF THE PREFERRED EMBODIMENT

The present invention will be described as it applies to its preferred embodiment. It is not intended that the present invention be limited to the described embodiment. It is intended that the invention cover all alternatives, modifications, and equivalences which may be included within the spirit and scope of the invention. In its preferred embodiment, the present invention applies to both radio receivers and transmitters, for purposes of this application, the term "transceiver" will be deemed to include a receiver, a transmitter, or a combination of the two unless otherwise specified. Further, for the purposes of this application, the terms "portable communication equipment", "portable communication device" or "wireless device" shall be deemed to include a wireless modem, cellular or PCS telephone, a receiver, a transmitter, or the like.

Figures 1, 2, 3:
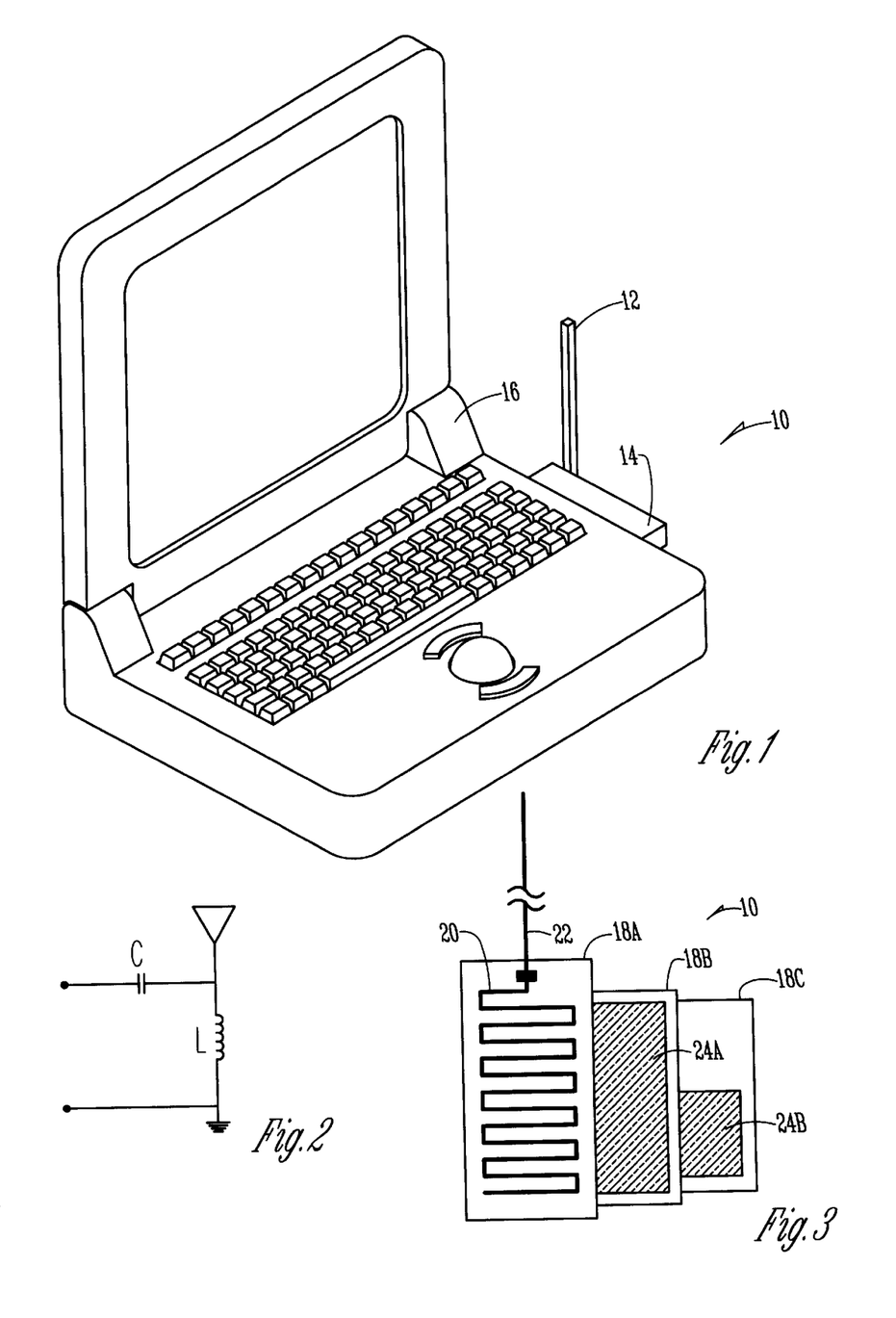
FIG. 1 is a perspective view illustrating a portable computer with a wireless modem.
FIG. 2 is an electrical schematic diagram of a matching circuit of the present invention.
FIG. 3 is an exploded perspective view of an integrated matched antenna assembly with a discrete wire radiator.

FIG. 1 shows an integrated matched antenna structure 10 which includes an antenna 12 and a matching circuit (not shown). The integrated circuit and antenna 10 is shown with a wireless modem 14 which is plugged into a PCMCIA slot of a portable computer 16. The user of the computer 16 may connect to a remote system by using communication software and the wireless modem 14 without the need for plugging the modem into a conventional wired phone line. The invention will work with PCMCIA cards for wireless communications such as WAN, LAN, ARDIS, RAM, CDPD, etc. The present invention has many other uses including uses with various portable communications devices such as wireless modems, cellular or PCS telephones, transceivers, etc.

FIG. 2 is an electrical schematic diagram showing a typical L-type matching circuit used to match the impedance of an antenna to a transceiver circuit. The matching circuit includes a capacitor C connected in series with an inductor L. The inductor L is connected at one end to an antenna and to ground at the other end. The matching circuit is connected to a transmitting or receiving circuit (not shown) in order to match the impedance of the antenna with the circuit.

The present invention utilizes printed circuit techniques to replace discrete components of a matching circuit, here a capacitor and inductor. The technique used to obtain the discrete element is based on the simple application of electronic theory. A capacitor in its simplest from consists of two parallel metallic plates separated by a dielectric material. The formula used to calculate the value of a capacitor is given by the formula:

$$C = \frac{8.85kA}{10^{12}s}$$

where C is the capacitance in farads, k is the dielectric constant, A is the area of each plate, and s is the spacing between the plates.

An inductor generally consists of a coil of wire. The inductance of the inductor is determined by the coil's diameter, the number of turns, and the length of the coil as described in the following formula:

$$L = \frac{N^2 uA}{l}$$

where L is the inductance of the inductor in henrys, N is the number of turns in the coil, u is the permeability, A is the cross-sectional area, and 1 is the length of coil.

The elements of the matching circuit shown in FIG. 2 are formed on a printed circuit board or on another type of dielectric substrate. The resulting matching circuit can take the form of a conventional single element, L-type, T-type, or Pi-type with the element or elements connected in the appropriate manner to obtain the required impedance transfer.

The capacitor element C in the circuit is formed with the area of the plates selected to best meet the required capacitance value and meet the physical form factor of the antenna assembly. The inductor may be formed by a meandering trace without a cylindrical cross section. The components may be formed on the substrate in a number of ways, including printing, etching, bonding, or machining traces on the substrate. Bonding is defined as a stamping process or material that would be bonded to the substrate. These methods of forming components eliminate the need to physically place components on the circuit board.

FIGS. 3–9 illustrate various embodiments of integrated matched antenna assemblies of the present invention. FIGS. 10–22 illustrate detailed examples of integrated matched antenna assemblies of the present invention.

FIG. 3 shows an exploded perspective view of the integrated matched antenna assembly 10 of the present invention. The assembly 10 includes a multilayer printed circuit board. Note that a "multilayer" substrate may include a double-sided printed circuit board, more that one printed circuit board, or any other dielectric substrate having a plurality of layers. The number of layers used could depend on what capacitance is desired or how many capacitors need to be formed. As shown, the multilayer printed circuit board includes three layers 18A, 18B and 18C. Printed on the first layer 18A is a planar inductor 20. Connected to one end of the printed inductor 20 is an antenna 22 which is shown as a discrete wire radiator. The antenna could take on many forms. The antenna could be deposited, machined, or bonded to the substrate. The antenna could also be flexible as well as rigid. A capacitor is formed on the integrated matched antenna assembly 10 on printed circuit board layers 18B and 18C. A first capacitor plate 24A is printed on the printed circuit board 18B while a second capacitor plate 24B is printed on printed circuit board layer 18C. The inductor 20 and capacitor 24 form the appropriate LC circuit such as that shown in FIG. 2 to transform the input impedance of 50 ohm to that of the radiator 22. Details describing how the capacitor 24, inductor 20 and radiator 22 are connected together and connected to a transmitting or receiving circuit are discussed in detail below with reference to FIGS. 10–22.

Figures 4, 5:
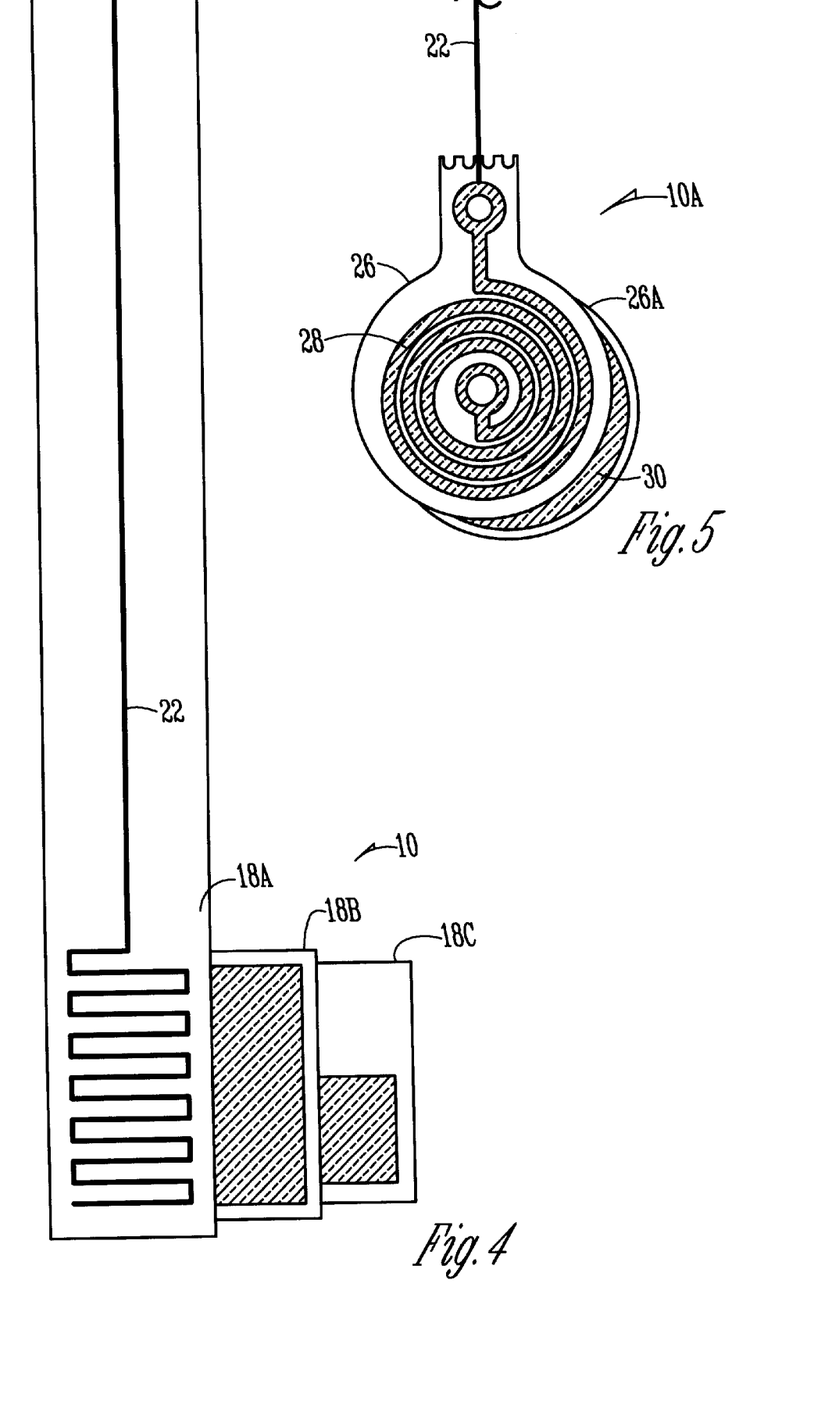
FIG. 4 shows an integrated multilayer matching circuit with an integrated radiator.
FIG. 5 is an embodiment of the present invention using a printed spiral inductor.

FIG. 4 shows an embodiment similar to FIG. 3 where the radiating element 22 is formed on the dielectric substrate as opposed to being a discrete wire antenna as in FIG. 3. The antenna 22 in FIG. 4 is formed on layer 18A of the multilayer printed circuit board 18. The remaining components shown in FIG. 4 are the same as that shown and described in FIG. 3.

Figure 6:
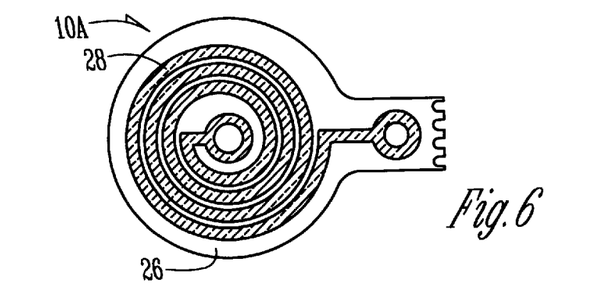
FIGS. 6–8 are detailed views of the matching circuit shown in FIG. 5.
Figure 7:
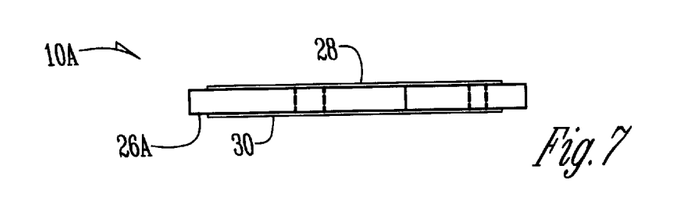
Figure 8:
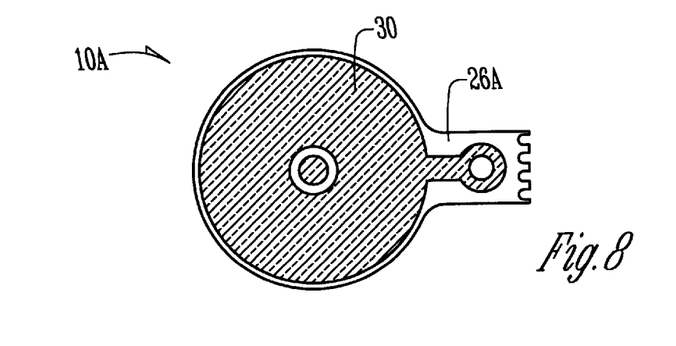
Figure 9:
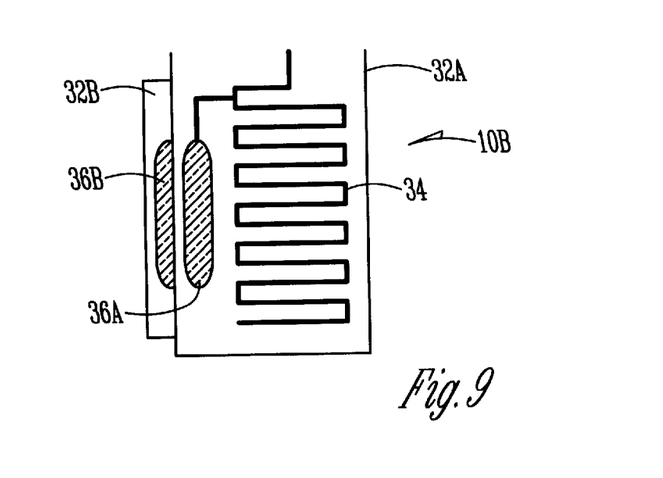
FIG. 9 is a detailed view of a single substrate matching circuit with a planar inductor.

FIGS. 5–8 illustrate an integrated matched antenna assembly 10A. FIG. 5 shows the front and back sides of the assembly 10A while FIGS. 6, 7, and 8 show top, side, and bottom views, respectively, of the assembly 10A. Assembly 10A includes a dielectric substrate shown as a double sided printed circuit board 26. The back side of the printed circuit board 26 is shown as 26A in FIG. 5. While FIG. 5 appears to show two separate substrates, the backside 26A of printed circuit board 26 is shown separated from printed circuit board 26 in FIG. 5 for clarity purposes.

As shown in FIGS. 5 and 6, a spiral inductor 28 is printed on the front side of printed circuit board 26. The inductor 28 is shown as a spiral inductor, but could have a rectangular or oval shape, for example. The inductor 28 has a first end near the center of the substrate 26 and a second end near the edge of the substrate. A capacitor plate 30 is formed on the back side 26A of the printed circuit board 26 (FIGS. 7 and 8). The remainder of the capacitor (not shown) is the physical body of the connector which will connect the assembly 10A to a transmitting or receiving circuit. Detailed examples of this are described below. A discrete antenna radiator 22 similar to the one shown in FIG. 3 is connected to the second end of the spiral inductor 28 (FIG. 5). Like the assembly 10 shown in FIG. 4, the radiator 22 of FIG. 5 could also be formed on the printed circuit board 26.

Like FIGS. 5–8, FIG. 9 shows an integrated matched antenna assembly 10B which is formed on a double sided printed circuit board having a front side 32A and a back side 32B. Like FIG. 5, while FIG. 9 appears to show two separate substrates, the backside 32B of the printed circuit board is shown separated from the front side 32A of printed circuit board in FIG. 9 for clarity purposes. On the first side 32A of the printed circuit board, a planar inductor 34 is printed. Also on printed circuit board 32A is a first capacitor plate 36A. On the back side 32B of the printed circuit board, a second capacitor plate 36B is formed to complete the capacitor. A radiating element (not shown) can be attached to this matching circuit as illustrated above.

Figure 10:
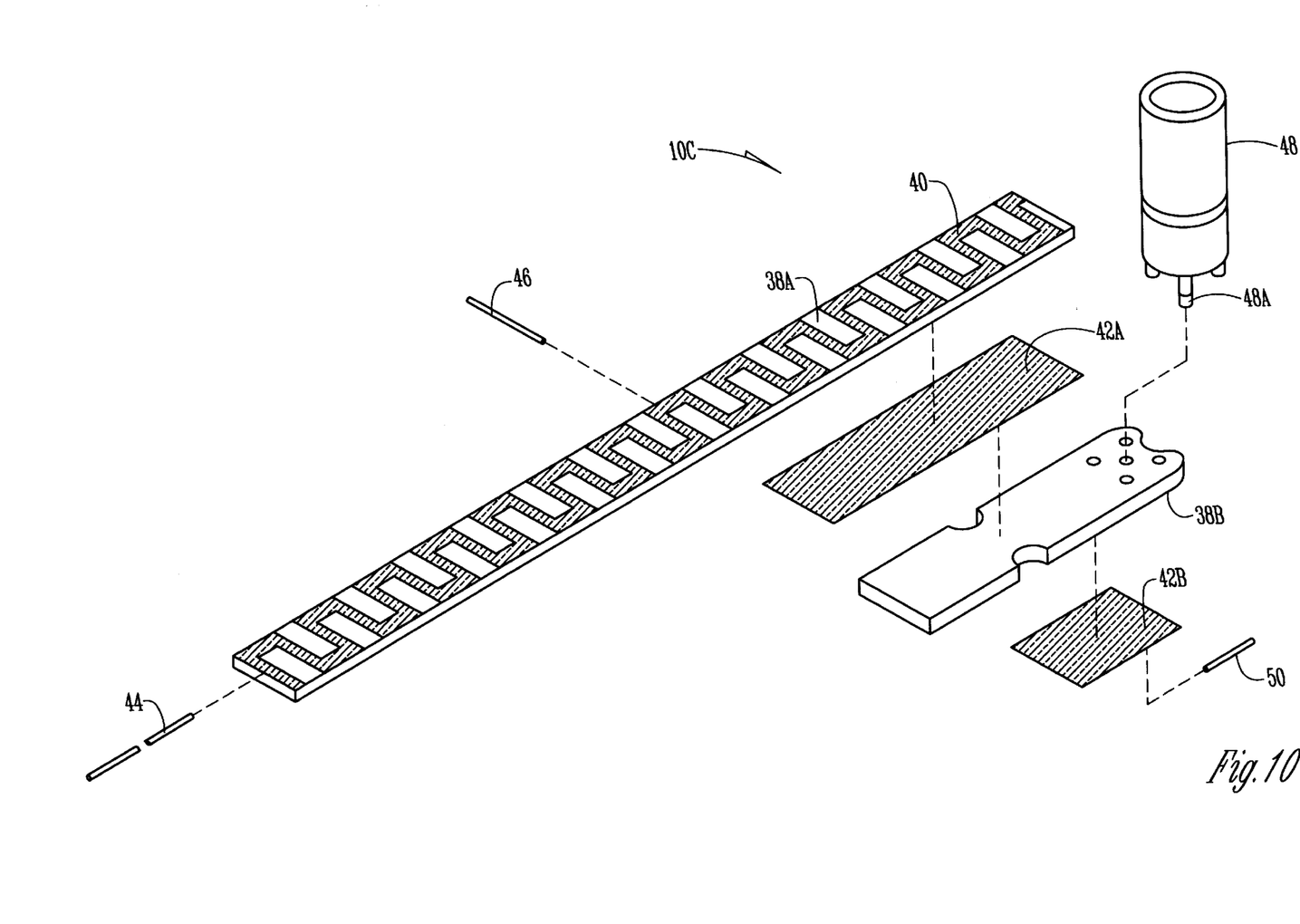
FIG. 10 is an exploded perspective view of an embodiment of the present invention.
Figure 11:
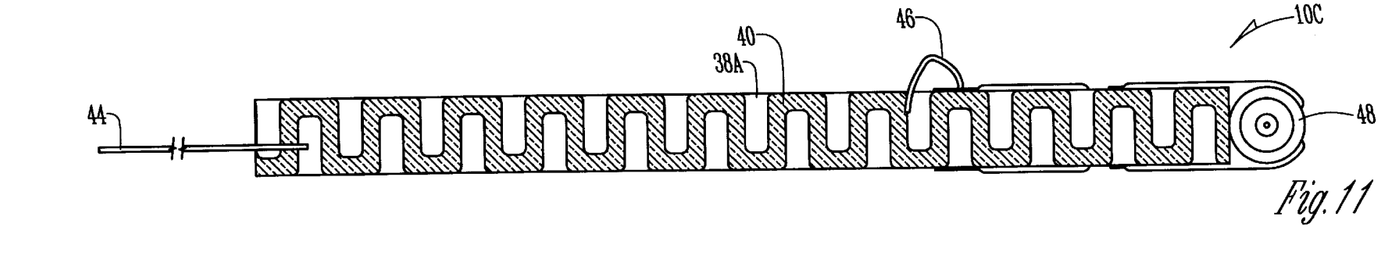
FIGS. 11–13 are detailed views showing the matching circuit of FIG. 10.
Figure 12:
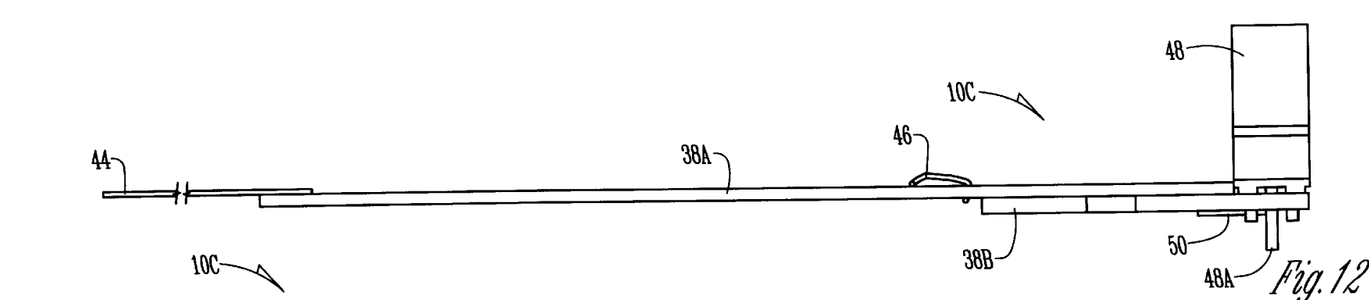
Figure 13:
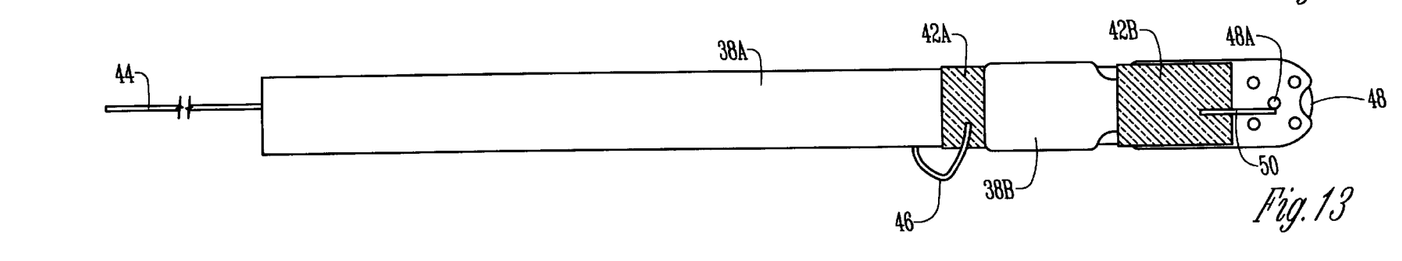

FIGS. 10–13 show a detailed example of one embodiment of the integrated matched antenna assembly 10C of the present invention. FIG. 10 is an exploded view of the antenna assembly 10C while FIGS. 11, 12, and 13 show a top, side, and bottom view, respectively, of the antenna assembly 10C.

The integrated matched antenna assembly 10C is comprised of two layers of a dielectric substrate comprised of first and second printed circuit boards 38A and 38B. Formed on the first printed circuit board 38A is a planar inductor 40 which spans the length of printed circuit board 38A. Between the first and second printed circuit boards 38A and 38B is a first capacitor plate 42A which is formed using printed circuit techniques. The capacitor plate 42A could be formed on either of the boards 38A and 38B. Formed on the bottom side of the second printed circuit board 38B is a second capacitor plate 42B. Together, the capacitor plates 42A and 42B form an integrated capacitive element.

A radiating element 44 comprised of a discrete wire antenna is connected to one end of the inductor 40 as shown in the figures. Alternatively, as is illustrated in FIG. 4, the radiating element 44 could be comprised of an antenna printed on a dielectric substrate such as printed circuit board 38A. A conductor 46, comprised of a wire, provides an electrical connection between capacitor plate 42A and the inductor 40. This is best shown in FIGS. 11–13. A coax connector 48 is used to connect the integrated matched circuit to an electronic circuit such as a receiver or transmitter (not shown). The coax connector 48 includes a terminal 48A which is connected to the center connector of a coax cable that is attached to the coax connector 48. The terminal 48A is connected to the second capacitor plate 42B by a conductor 50 which is soldered to both parts. The coax connector 48 is grounded to complete the matching circuit which is illustrated in FIG. 2.

As an alternative to using the conductors 46 and 50 to connect the various components of the assembly 10C, other connection methods may be used. For example, the conductor 46 could be replaced by a through hole which would pass through the printed circuit board 38A which would connect the first capacitor plate 42A with the inductor 40 when the through hole is filled with solder or the like. The conductor 50 could be replaced by a trace etched in the printed circuit board 38B, for example. The coax connector 48 is also not required. Some other type of connector could be used, or the matching circuit could be wired or connected to a circuit in another way. Examples of other connection devices include microstrips, striplines, pin/socket connections, etc.

Figure 14:
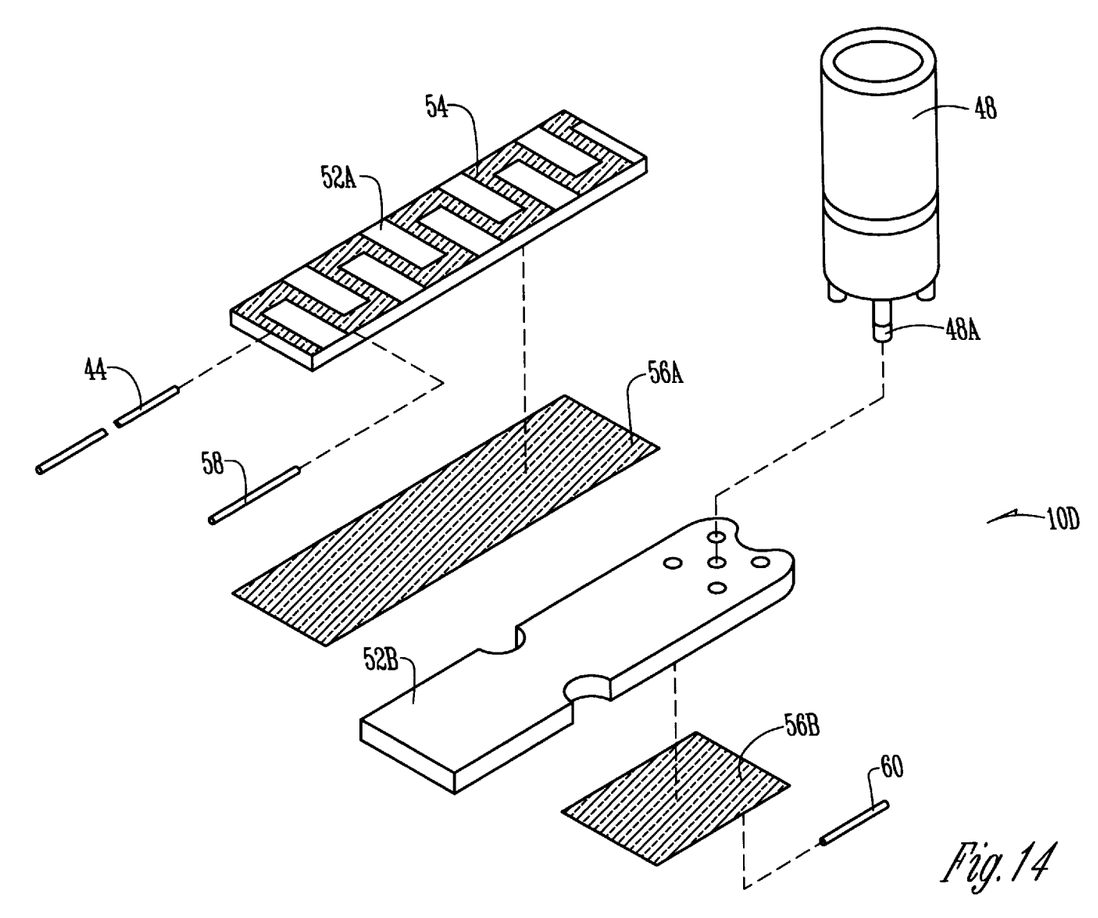
FIG. 14 is an exploded perspective view of another embodiment of the present invention.
Figure 15:
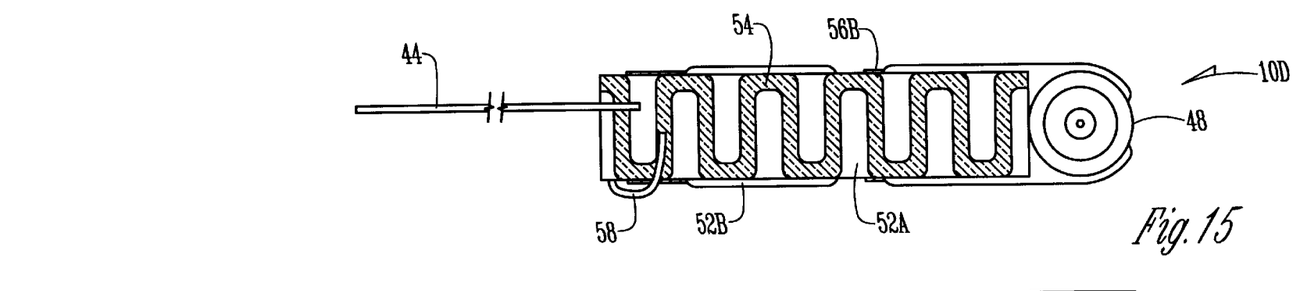
FIGS. 15–17 are detailed view showing the matching circuit of FIG. 14 assembled.
Figure 16:
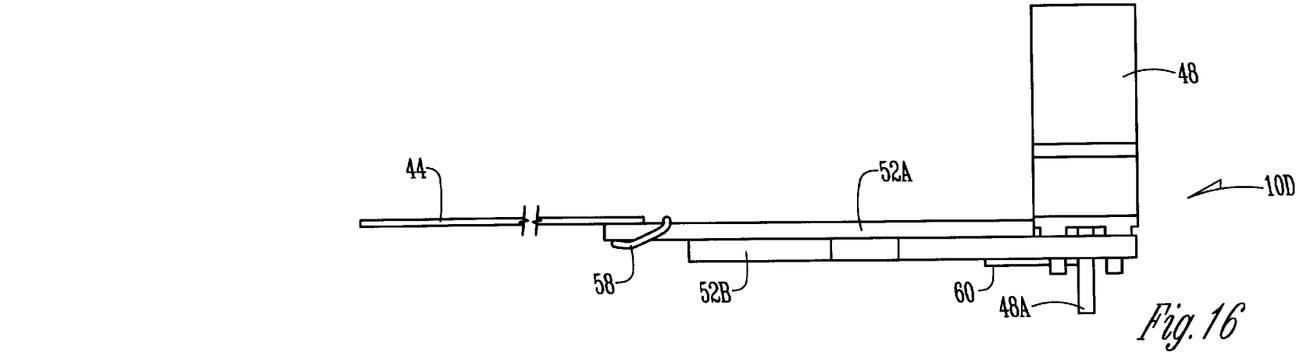
Figure 17:
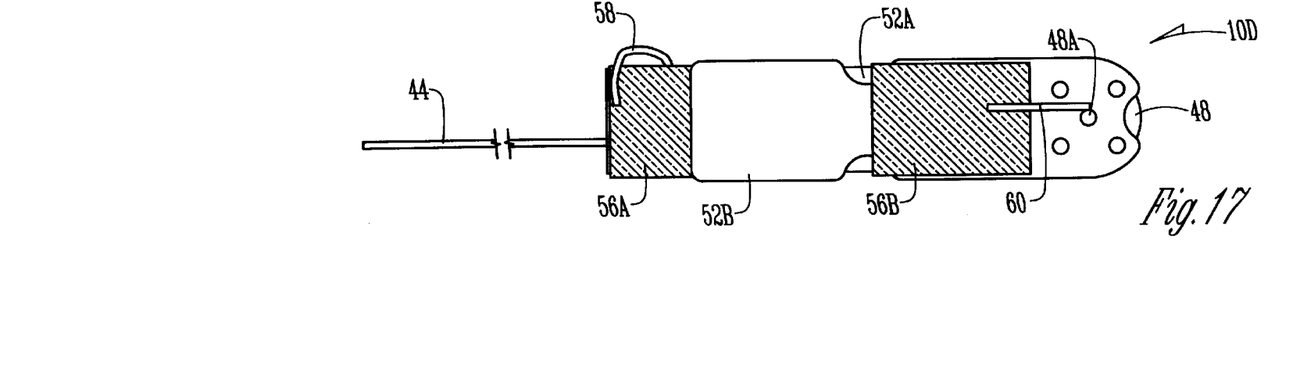

FIGS. 14–17 show a detailed example of another embodiment of the integrated matched antenna assembly of the present invention. FIG. 14 is an exploded view of the antenna assembly 10D while FIGS. 15, 16, and 17 show top, side, and bottom views, respectively, of the antenna assembly 10D.

The integrated matched antenna assembly 10D is comprised of two layers of a dielectric substrate comprised of first and second printed circuit boards 52A and 52B. Formed on the first printed circuit board 52A is a planar inductor 54 which spans the length of printed circuit board 52A. Between the first and second printed circuit boards 52A and 52B is a first capacitor plate 56A which is formed using printed circuit techniques. Formed on the bottom side of the second printed circuit board 52B is a second capacitor plate 56B. Together, the capacitor plates 56A and 56B form an integrated capacitive element.

A radiating element 44 is connected to one end of the inductor 54 as shown in the figures. The radiating element 44 is shown as a discrete wire antenna, although, as is illustrated in FIG. 4, could be comprised of an antenna printed on a dielectric substrate such as printed circuit board 52A. A conductor 58, comprised of a wire, provides an electrical connection between capacitor plate 56A and the inductor 54. This is best shown in FIGS. 15–17. A coax connector 48 is used to connect the integrated matched circuit to an electronic circuit such as a receiver or transmitter (not shown). The coax connector 48 includes a terminal 48A which is connected to the center connector of a coax cable that is attached to the coax connector 48. The terminal 48A is connected to the second capacitor plate 56B by a conductor 60 which is soldered to both parts. The coax connector 48 is grounded to complete the matching circuit which is illustrated in FIG. 2.

Again, as an alternative to using the conductors 58 and 60 to connect the various components of the assembly 10D, other connection methods may be used. For example, the conductor 58 could be replaced by a through hole and filler as described above. The conductor 60 could be replaced by a trace etched in the printed circuit board 52B, for example.

Figure 18:
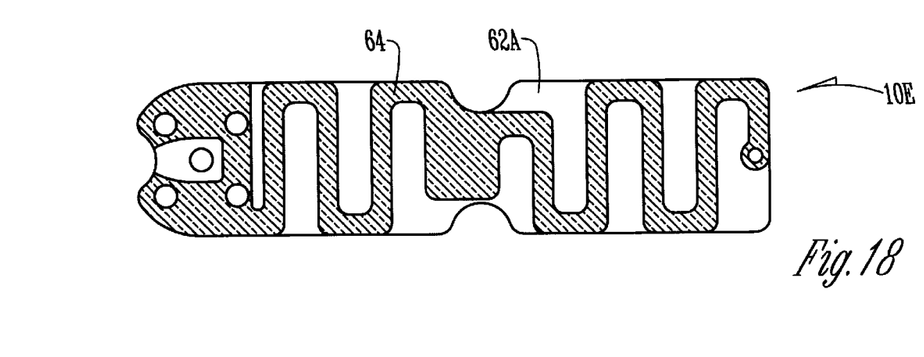
FIGS. 18–20 show detailed views of another embodiment of the present invention.
Figure 19:
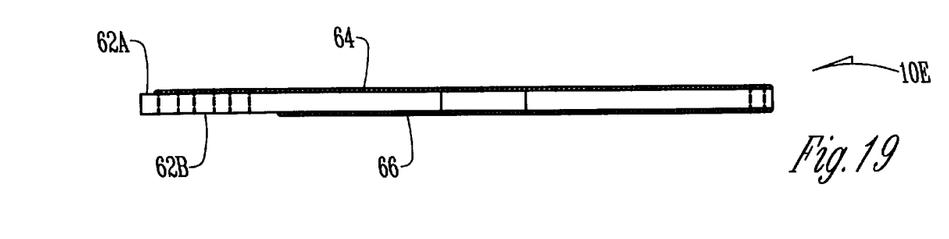
Figure 20:
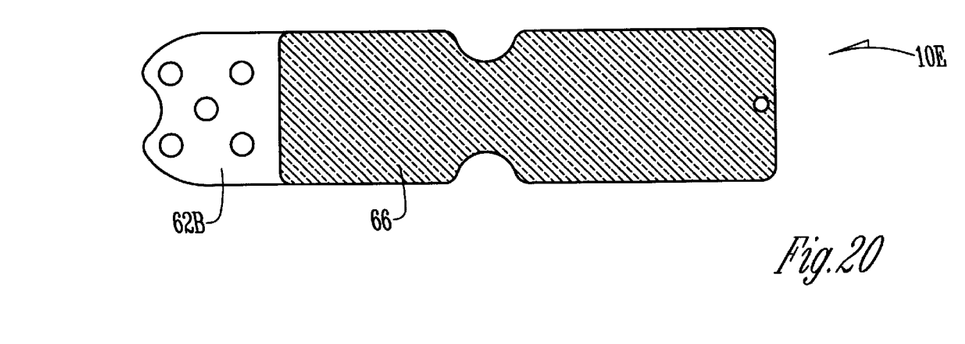

FIGS. 18–20 show another example of an embodiment of the integrated matched antenna assembly of the present invention. FIGS. 18, 19, and 20 show top, side, and bottom views, respectively, of an antenna assembly 10E.

The integrated matched antenna assembly 10E is comprised of a single dielectric substrate having top and bottom sides 62A and 62B, respectively. Formed on the top side printed circuit board 62A is a planar inductor 64 which spans the length of printed circuit board 62A. Near the center of the board 62A, the inductor includes a rectangular plate. A first capacitor plate 66 is formed on the back side 62B of the printed circuit board. A coax connector 48 is used to connect the integrated matched circuit to an electronic circuit as discussed above (not shown). As discussed above with respect to FIGS. 5–9, the capacitor plate 56 and connector 48 form an integrated capacitive element for the antenna assembly 10E. Alternatively, the capacitor plate 56 and a portion of the inductor 64 could form the capacitive element.

A radiating element is connected to one end of the inductor 64 (not shown) as discussed above. The components of antenna assembly 10E are electrically connected together as discussed above.

Figure 21:
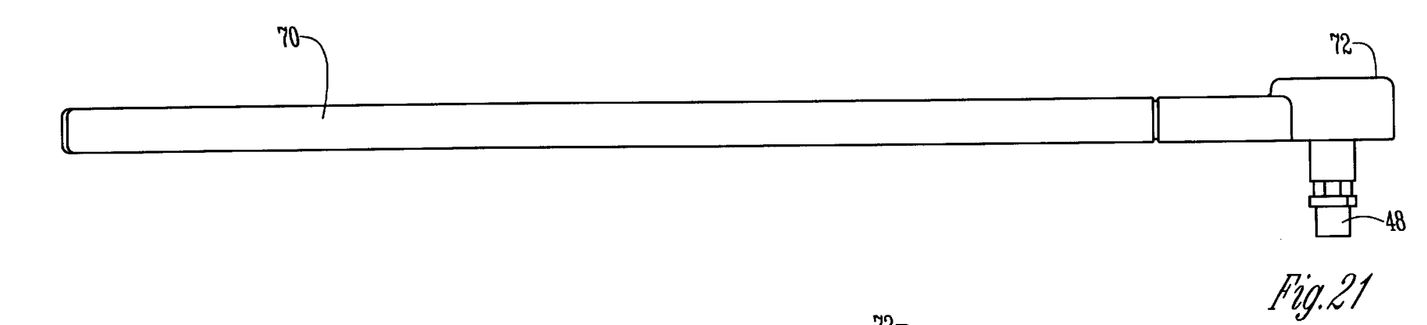
FIGS. 21–22 show the integrated matched antenna assembly of FIGS. 6–8 enclosed in a housing.
Figure 22:
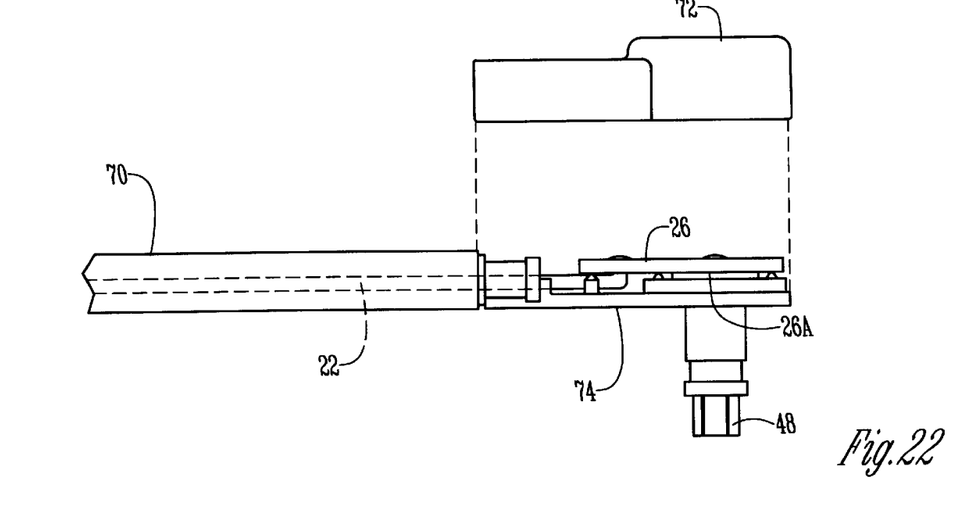

After assembling the integrated matched antenna assembly 10, the radiating element and matching circuit are encapsulated by a radio permeable material to protect the assembly. FIG. 21 shows an antenna casing 70 and cap 72 enclosing the matched antenna assembly 10A which is shown in FIGS. 5–8. FIG. 22 shows the casing 70 with the cap 72 removed from a lower cap 74. Under the cap 72 is the printed circuit board 26 which includes inductor 28 and capacitor plate 30 (FIGS. 6–8). As can be seen, the entire matching circuit and antenna are enclosed within the casing 70 and cap 72. Similar casings may be used with all of the embodiments of the present invention.

An integrated matching or loading circuit using the present invention is not limited to inductors and capacitors. Other integrated devices, such as switching devices, such as devices to switch different networks in and out, could be incorporated. Also, a mixture of integrated and discrete devices could be used together.

The integrated matching circuit is preferably rigid, although it could be flexible and may also be embedded or conformal or otherwise protected to the confines of a housing. Where the items is the above description are defined as metallic, they could be made of metal or some other material that is conductive such as electropositive substrates or other electrically conductive polymers.

The preferred embodiment of the present invention has been set forth in the drawings and specification, and although specific terms are employed, these are used in a generic or descriptive sense only and are not used for purposes of limitation. Changes in the form and proportion of parts as well as in the substitution of equivalents are contemplated as circumstances may suggest or render expedient without departing from the spirit and scope of the invention as further defined in the following claims.

What is claimed is:

1. An integrated matched antenna assembly comprising:
   a printed circuit board;
   a matching circuit, the matching circuit further comprising:
   an inductor formed on the printed circuit board, the inductor being comprised of a conductive strip disposed on the printed circuit board and having a first and second end,
   a capacitive element electrically connected to the inductor, the capacitive element having first and second conductors disposed in a spaced relation to provide a capacitance, at least one of the conductors being formed on the printed circuit board; and
   an antenna electrically connected directly to the inductor of the matching circuit.

2. The integrated matched antenna assembly of claim 1 wherein the conductive strip forms a plurality of loops on the substrate.

3. The integrated matched antenna assembly of claim 2 wherein the loops are rounded.

4. The integrated matched antenna assembly of claim 2 wherein the loops are rectangular in shape.

5. The integrated matched assembly of claim 2 wherein the first conductor of the capacitive element is formed on the printed circuit board.

6. The integrated matched antenna assembly of claim 5 further comprising a connector electrically connected to the matching circuit, wherein the second conductor of the capacitive element is comprised of a portion of the connector.

7. The integrated matched antenna assembly of claim 6 further comprising a housing enclosing the matching circuit.

8. The integrated matched antenna assembly of claim 7 wherein the housing encloses the matching circuit and the antenna.

9. The integrated matched antenna assembly of claim 5 wherein the substrate has two opposing sides and wherein the first conductor of the capacitive element is disposed on the printed circuit board on the side opposite the conductive strip.

10. The integrated matched antenna assembly of claim 1 wherein the inductor and capacitive elements are formed on the printed circuit board using printing techniques.

11. The integrated matched antenna assembly of claim 1 wherein the printed circuit board is a multilayer substrate.

12. The integrated matched antenna assembly of claim 11 wherein the inductor, first conductor, and second conductor are each formed on separate layers of the multilayer printed circuit board.

13. The integrated matched antenna assembly of claim 11 wherein one of the layers of the multilayer printed circuit board is larger in area than another layer of the multilayer printed circuit board.

14. The integrated matched antenna assembly of claim 1 wherein the antenna is formed on the printed circuit board.

15. The integrated matched antenna assembly of claim 1 wherein the antenna is comprised of a discrete radiating element electrically connected to the matching circuit.

16. The integrated matched antenna assembly of claim 1 wherein the conductive strip of the inductor is disposed on the printed circuit board in an S-shaped pattern.

17. The integrated matched antenna assembly of claim 1, wherein the antenna is connected to the first end of the inductor, and wherein the second end of the inductor is grounded.

18. The integrated matched antenna assembly of claim 17, wherein the capacitor is connected to the first end of the inductor.

19. The integrated matched antenna assembly of claim 1, wherein the printed circuit board is comprised of a double sided printed circuit board, wherein the first and second conductors of the capacitive element are printed on opposites sides of the double sided printed circuit board.

20. An integrated matched antenna assembly for use with an electronic circuit comprising:
   a printed circuit board having a plurality of layers;
   an inductor formed on the printed circuit board, the inductor being comprised of a conductive strip disposed on the printed circuit board and having a first and second end;
   a capacitor electrically connected to the inductor, the capacitor having first and second conductors disposed in a spaced relation, the first conductor being formed on a first layer of the printed circuit board, the second conductor being formed on a second layer of the printed circuit board; and
   an antenna electrically connected directly to the inductor, wherein the inductor and capacitor form a matching circuit for matching the impedance of the antenna to the impedance of the electronic circuit.

21. The integrated matched antenna assembly of claim 20 wherein the conductive strip of the inductor is formed on the first layer of the printed circuit board.

22. The integrated matched antenna assembly of claim 21 wherein the capacitor is electrically connected to the inductor by a conductive trace formed on the first layer of the printed circuit board connecting the first conductor of the capacitor to the conductive strip of the inductor.

23. The integrated matched antenna assembly of claim 20 wherein the inductor is formed on a third layer of the printed circuit board.

24. The integrated matched antenna assembly of claim 23 wherein the first layer of the printed circuit board is elongated.

25. The integrated matched antenna assembly of claim 24 wherein the second and third layers of the printed circuit board are smaller in surface area than the first layer of the printed circuit board.

26. The integrated matched antenna assembly of claim 25 wherein the capacitor is electrically connected to the inductor at a point between the first and second ends of the conductive strip of the inductor.

27. The integrated matched antenna assembly of claim 20 wherein the antenna is formed on one of the plurality of layers of the printed circuit board.

28. The integrated matched antenna assembly of claim 20, wherein plurality of layers of the printed circuit board closely abut each other in a parallel relation.

29. A method of matching the impedance of an antenna to an electronic circuit comprising the steps of:

provriding a printed circuit board having a plurality of surfaces;

forming an inductor on the printed circuit board by printing a conductive trace on one of the surfaces of the printed circuit board;

forming a capacitor on the printed circuit board by printing a first conductor on a first surface of the printed circuit board and printing a second conductor on a second surface of the printed circuit board;

providing an antenna;

electrically connecting the inductor to the capacitor;

electrically connecting the electronic circuit to the inductor and capacitor; and electrically connecting the antenna to the inductor and capacitor.

30. The method of claim 29, wherein the step of electrically connecting the antenna to the inductor and capacitor further comprises the step of electrically connecting the antenna directly to the inductor.

31. The method of claim 29, further comprising the step of arranging the plurality of surfaces of the printed circuit board in a stacked, abutting, parallel relation.

\* \* \* \* \*